United States Patent
Okamoto

(10) Patent No.: US 9,444,483 B2
(45) Date of Patent: Sep. 13, 2016

(54) SWITCH CIRCUIT, ANALOG-TO-DIGITAL CONVERTER, AND INTEGRATED CIRCUIT

(71) Applicant: SOCIONEXT INC., Yokohama-shi, Kanagawa (JP)

(72) Inventor: Seiji Okamoto, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/757,547

(22) Filed: Dec. 24, 2015

(65) Prior Publication Data
US 2016/0226506 A1 Aug. 4, 2016

(30) Foreign Application Priority Data
Jan. 29, 2015 (JP) .................................. 2015-016032

(51) Int. Cl.
*H03M 1/00* (2006.01)
*H03M 1/12* (2006.01)
*H03K 17/06* (2006.01)
*G11C 27/02* (2006.01)

(52) U.S. Cl.
CPC ............ *H03M 1/1245* (2013.01); *G11C 27/02* (2013.01); *H03K 17/063* (2013.01)

(58) Field of Classification Search
CPC .... H03M 1/06; H03M 1/664; H03M 1/1023; H03M 1/1245; H02M 3/1588; G11C 27/024; G11C 27/02; G11C 27/026
USPC .............................. 341/122; 327/91, 94, 175
See application file for complete search history.

(56) References Cited

U.S. PATENT DOCUMENTS

| | | | | |
|---|---|---|---|---|
| 5,341,137 A * | 8/1994 | Yee | ....................... | H03M 1/141 341/141 |
| 6,275,076 B1 * | 8/2001 | Simony | ................ | G11C 27/026 327/94 |
| 6,310,565 B1 * | 10/2001 | Ong | ..................... | G11C 27/024 327/91 |
| 6,489,576 B2 * | 12/2002 | Ito | .......................... | H01H 13/70 200/304 |
| 6,498,576 B1 * | 12/2002 | Tian | ................... | H04N 1/00307 341/122 |

(Continued)

FOREIGN PATENT DOCUMENTS

JP 09-200015 A 7/1997
JP 2005-333465 A 2/2005

(Continued)

OTHER PUBLICATIONS

Abo et al., A 1.5-V, 10-BIT, 14.3-MS/S CMOS Pipeline Analog-to-Digital Converter, IEEE Journal of Solid-State Circuits, vol. 34, No. 5, May 1999.

(Continued)

*Primary Examiner* — Lam T Mai
(74) *Attorney, Agent, or Firm* — Arent Fox LLP

(57) ABSTRACT

A switch circuit includes: a sampling transistor including a source connected to an input node and a drain connected to an output node; a control circuit which is connected to a gate of the sampling transistor and configured to control turning on or off of the sampling transistor; a voltage holding circuit which is provided between the gate and the source of the sampling transistor and configured to maintain a voltage between the gate and the source of the sampling transistor constant when the sampling transistor is turned on; and a protection circuit which is provided in parallel to the control circuit and configured to lower a voltage that is applied to the gate of the sampling transistor when the sampling transistor makes a transition from on to off.

15 Claims, 9 Drawing Sheets

(56) References Cited

U.S. PATENT DOCUMENTS

| | | | | |
|---|---|---|---|---|
| 7,221,191 | B2* | 5/2007 | Ali | G11C 27/026 327/94 |
| 7,453,291 | B2* | 11/2008 | Song | G11C 27/02 327/91 |
| 7,724,161 | B1* | 5/2010 | Cyrusian | H03M 5/08 327/157 |
| 7,816,951 | B1* | 10/2010 | Lee | G11C 27/024 327/94 |
| 8,400,337 | B1* | 3/2013 | Xu | H03F 3/45183 327/307 |
| 8,525,556 | B2* | 9/2013 | Singh | G11C 27/02 327/91 |
| 2005/0258874 | A1 | 11/2005 | Kudo | |
| 2010/0309184 | A1 | 12/2010 | Yamamoto et al. | |

FOREIGN PATENT DOCUMENTS

| | | |
|---|---|---|
| JP | 2012-204809 A | 10/2012 |
| WO | WO 2009/084269 A1 | 7/2009 |

OTHER PUBLICATIONS

Abo, Andrew Masami, "Design for Reliability of Low-Voltage, Switched-Capacitor Circuits," Ph.D. dissertation, California Institute of Technology Pasadena, CA, USA, 1999.

* cited by examiner

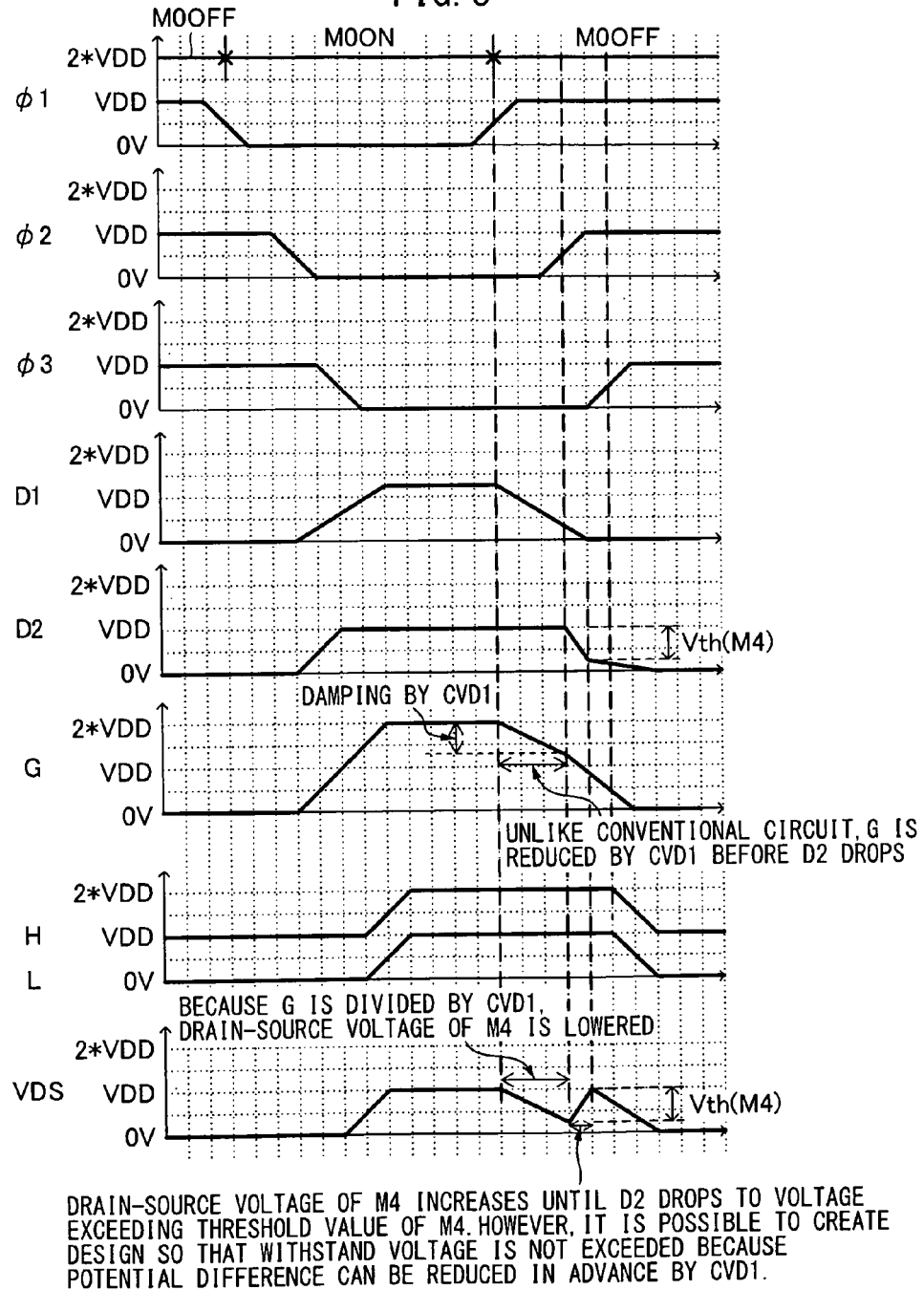

SWITCH CIRCUIT, ANALOG-TO-DIGITAL CONVERTER, AND INTEGRATED CIRCUIT

CROSS-REFERENCE TO RELATED APPLICATION

This application is based upon and claims the benefit of priority of the prior Japanese Patent Application No. 2015-016032, filed on Jan. 29, 2015, the entire contents of which are incorporated herein by reference.

FIELD

The technique disclosed herein relates to a switch circuit, an analog-to-digital converter, and an integrated circuit.

BACKGROUND

It is important for the characteristics of a switch that is used via an analog signal not to distort the analog signal through the on-resistance of the switch. An analog-to-digital converter (ADC) has a switch circuit and a sampling capacitor. In the ADC, in the case where a distortion occurs in a signal due to the switch circuit configured to sample an analog signal, the conversion characteristics of the ADC are worsened accordingly. A transistor that is used to sample an analog signal by a switch circuit of the ADC is referred to as a sampling transistor. Hereinafter, not limited to the ADC, a transistor that forms an analog switch turning on or off an analog signal is referred to as a sampling transistor here. In other words, what is referred to as a sampling transistor is not limited to the ADC, and whatever is used as a main switch of an analog switch circuit may be referred to as a sampling transistor.

As a switch circuit configured to sample an analog signal, a CMOS switch having an NMOS and a PMOS connected in parallel is used, but a gate-source voltage Vgs of the NMOS and PMOS changes in accordance with an input voltage. Because of this, in the CMOS switch, the on-resistance changes depending on the input voltage and a distortion occurs in an analog signal.

As a technique for improving accuracy of analog signal processing by reducing the distortion of a signal, which occurs due to a change in the on-resistance depending on the input voltage, a bootstrap switch (hereinafter, referred to as BSW) is known. It is possible for the BSW to maintain the gate-source voltage of a sampling transistor almost constant. By using the BSW in a switch circuit of an analog signal, it is possible to improve the accuracy of analog signal processing by reducing the distortion of a signal, which occurs due to a change in the on-resistance.

In recent years, the operation voltage is lowered remarkably in order to reduce power consumption and further, miniaturization of a circuit element is in progress, and therefore, the withstand voltage of a circuit element is lowered. The withstand voltage of the transistor forming the BSW is also lowered and the withstand voltage of the transistor of the BSW has lowered below a value twice the power source voltage. In the above-described BSW, if the input signal swings fully between 0 V and a power source voltage VDD, a case may occur where a voltage about twice the power source voltage is applied to a transistor, which is a part of the circuit, when the sampling transistor makes a transition from on to off.

In order to avoid this problem of withstand voltage, the control circuit configured to reduce the gate voltage of the sampling transistor to a low potential when the sampling transistor is turned off is formed by transistors in two stages connected in series, and the voltage that is applied to each transistor is reduced.

RELATED DOCUMENTS

[Patent Document 1] Japanese Laid Open Patent Publication No. 2005-333465
[Non Patent Document 1] A. M. Abo, "Design for reliability of low-voltage, switched-capacitor circuits," Ph.D. dissertation, California Institute of Technology, Pasadena, Calif., USA, 1999.
[Non Patent Document 2] A. M. Abo and P. R. Gray, "A 1.5-V, 10-bit, 14.3-MS/s CMOS pipeline analog-to-digital converter," IEEE J. Solid-State Circuits, vol. 34, no. 5, pp. 599-606, May 1999.

SUMMARY

According to an aspect of the embodiments, a switch circuit includes: a sampling transistor having a source connected to an input node and a drain connected to an output node; a control circuit which is connected to a gate of the sampling transistor and configured to control turning on or off of the sampling transistor; a voltage holding circuit which is provided between the gate and the source of the sampling transistor and configured to maintain a voltage between the gate and the source of the sampling transistor constant when the sampling transistor is turned on; and a protection circuit which is provided in parallel to the control circuit and configured to lower a voltage that is applied to the gate of the sampling transistor when the sampling transistor makes a transition from on to off.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 3A illustrates a state where the sampling transistor is off and FIG. 3B illustrates a state where the sampling transistor is on;
FIG. 4A illustrates the state where the sampling transistor is off and FIG. 4B illustrates the state where the sampling transistor is on;

FIG. 7 is a circuit diagram of the bootstrap switch (BSW) of the embodiment, illustrating the state where the sampling transistor is on;

FIG. 8 is a diagram illustrating the operation sequence of the BSW of the embodiment;

DESCRIPTION OF EMBODIMENTS

Before explaining the switch circuit of an embodiment, a general switch circuit is explained.

Figure 1A:
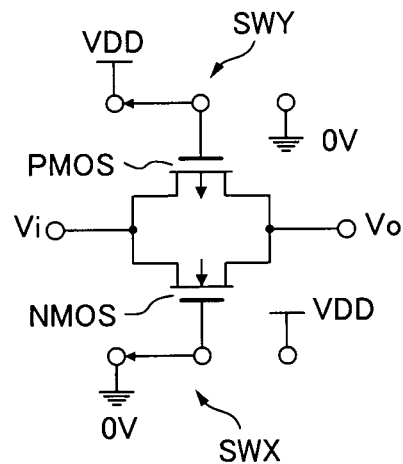
FIG. 1A illustrates a circuit configuration of a CMOS switch.
Figure 1B:
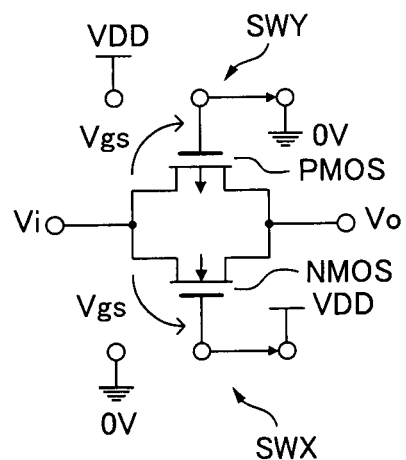
FIG. 1B is a diagram for explaining the operation of the circuit in FIG. 1A.
Figure 1C:
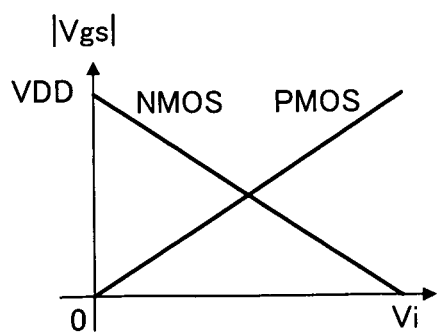
FIG. 1C illustrates a change in the gate-source voltage Vgs of a transistor.

FIG. 1A illustrates a circuit configuration of a CMOS switch. FIG. 1B is a diagram for explaining the operation of the circuit in FIG. 1A. FIG. 1C illustrates a change in the gate-source voltage Vgs of a transistor.

The CMOS switch is used widely as a switch that samples an analog signal. The CMOS switch has an NMOS and a PMOS connected in parallel between an input node and an output node, a switch SWX that switches the gate of the NOMS between 0 V and VDD, and a switch SWY that switches the gate of the PMOS between VDD and 0 V.

As illustrated in FIG. 1A, when the switch SWX is connected to 0 V and the switch SWY to VDD, the NMOS and the PMOS turn off and the CMOS switch enters the cutoff state. As illustrated in FIG. 1B, when the switch SWX is connected to VDD and the switch SWY to 0 V, the NMOS and the PMOS turn on, and the CMOS switch enters the pass-through state and outputs an analog input signal Vi at the input node as an analog output signal Vo at the output node. In this case, as illustrated in FIG. 1C, the voltage Vgs of the NMOS and the PMOS changes in accordance with the voltage of the input signal Vi, and therefore, in the CMOS switch, the on-resistance changes depending on the input voltage and a distortion occurs in the analog signal.

As a technique for improving the accuracy of analog signal processing by reducing the distortion of the signal, which occurs accompanying the change in the on-resistance depending on the input voltage in the CMOS switch, a bootstrap switch (hereinafter, referred to as BSW) is known.

Figure 2A:
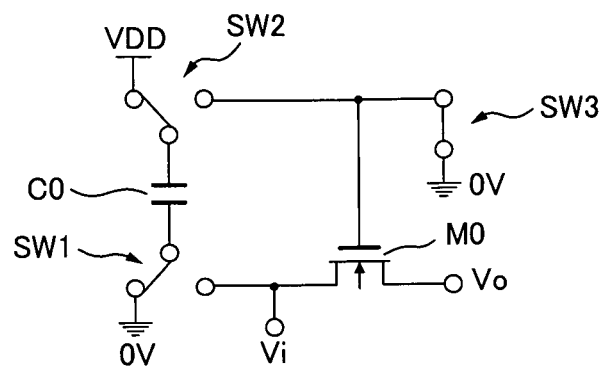
FIG. 2A illustrates a circuit configuration of a bootstrap switch (BSW)
Figure 2B:
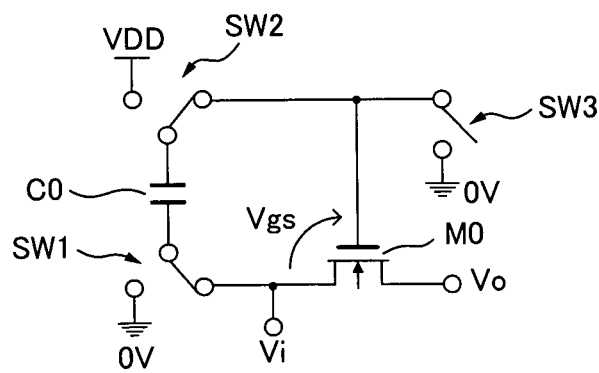
FIG. 2B is a diagram explaining the operation of the circuit in FIG. 2A.
Figure 2C:
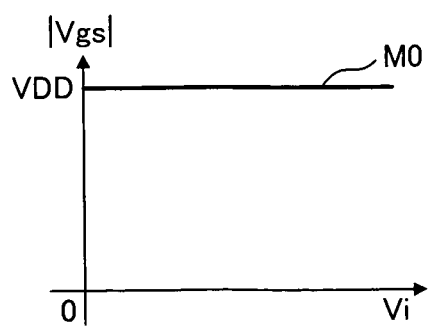
FIG. 2C illustrates a change in the gate-source voltage Vgs of the sampling transistor.

FIG. 2A illustrates a circuit configuration of a bootstrap switch (BSW). FIG. 2B is a diagram explaining the operation of the circuit in FIG. 2A. FIG. 2C illustrates a change in the gate-source voltage Vgs of the sampling transistor.

The BSW has an NMOS transistor M0 corresponding to the sampling transistor, a power storage capacitor element C0, and three switches SW1 to SW3. The M0 is connected between the input node and the output node and serves as a main transistor that transmits the analog input signal Vi as the analog output signal Vo. The SW1, C0, and SW2 are connected in series between a 0V power source (second potential power source) and a VDD power source (first potential power source). The voltage of the VDD power source (first potential power source) is, for example, 1.0 to 1.2 V, and is higher than the voltage (0 V) of the 0V power source (second potential power source). The SW2 switches one of terminals of the C0 so as to connect to the VDD power source or the gate of the M0. The SW1 switches the other terminal of the Co so as to connect to the 0V power source or the input node (source of M0). The SW3 switches between connecting the gate of the M0 to the 0-V power source and not connecting.

As illustrated in FIG. 2A, when the SW1 is connected to the 0V power source, the SW2 to the VDD power source, and the SW3 to the 0V power source, then, the M0 turns off and the BSW enters the cutoff state. At this time, the C0 is charged to VDD. As illustrated in FIG. 2B, when the SW1 is connected to the input node, the SW2 to the gate of the M0, and the SW3 is opened, then, a voltage Vi+VDD, which is the sum of the voltage Vi of the input signal and the charged voltage VDD of the C0, is applied to the gate of the M0, and therefore, the M0 turns on. Due to this, the analog input signal at the input node is output to the output node as the analog output signal Vo. As described above, the gate voltage of the M0 is Vi+VDD and the gate-source voltage Vgs of the M0 is kept almost constant as illustrated in FIG. 2C.

By using the BSW as a sampling switch of an analog signal, it is possible to reduce a distortion of the signal, which occurs when the on-resistance changes, and thereby, to improve the accuracy of analog signal processing.

However, the withstand voltage of the transistor forming the BSW is a value lower than twice the power source voltage and in the case where the BSW is implemented actually by the transistor, when the BSW makes a transition from on to off, there occurs a case where the withstand voltage is exceeded in part of transistors. If the withstand voltage is exceeded, the transistor will be destroyed.

Figure 3A:
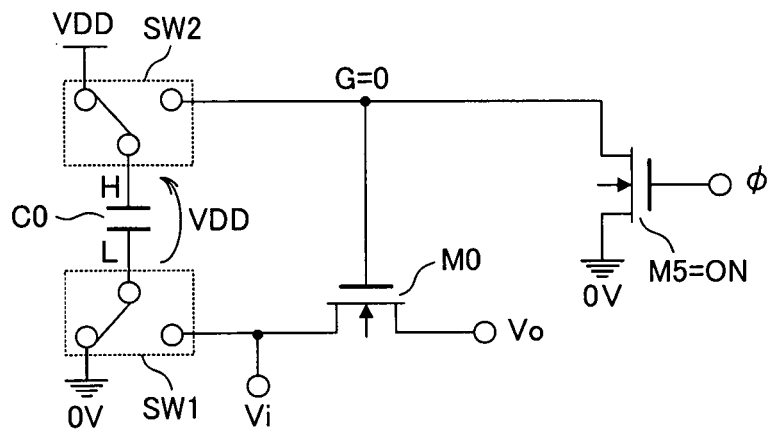
FIG. 3A and FIG. 3B are circuit diagrams, in which the switch whose withstand voltage may be exceeded is replaced with a transistor in the BSW in FIG. 2A.
Figure 3B:
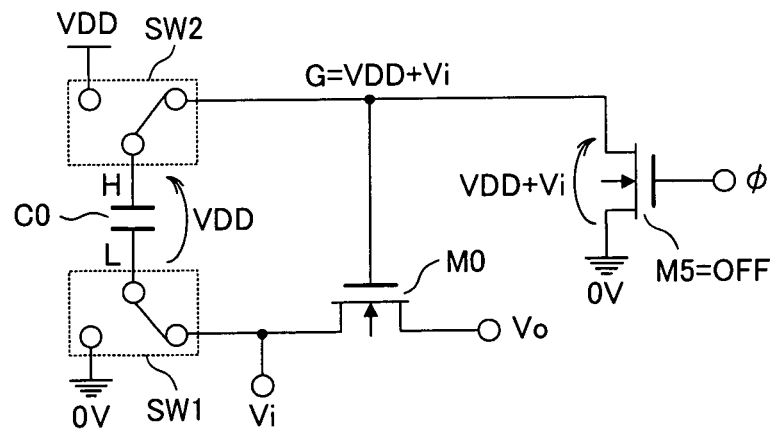

FIG. 3A and FIG. 3B are circuit diagrams, in which the switch whose withstand voltage may be exceeded is replaced with a transistor in the BSW in FIG. 2A, and FIG. 3 illustrates a state where the sampling transistor is off and FIG. 3B illustrates a state where the sampling transistor is on.

As illustrated in FIG. 3A and FIG. 3B, the SW3 is implemented by an NMOS transistor M5 connected between the gate of the M0 and the 0V power source. To the gate of the M5, a control signal Φ is applied.

As illustrate in FIG. 3A, when Φ=VDD (high level), the SW1 is connected to the 0V power source, the SW2 is connected to the VDD power source, and the SW3 is connected to the 0V power source and the M5 turns on, and the gate of the M0 (node G) becomes 0 V, and therefore, the M0 turns off and the BSW enters the cutoff state. At this time, the C0 is charged to VDD. The terminal at the high side of the C0 is denoted by H and the terminal at the low side by L.

As illustrate in FIG. 3B, when c=0 V (low level), the SW1 is connected to the input node, the SW2 is connected to the gate of the M0, and the gate of the M5 becomes 0 V and the M5 turns off, and to the gate of the M0 (node G), the input signal Vi+VDD is applied, and therefore, the M0 turns on and the BSW enters the conduction state.

For example, a case is considered where Vi fully swings between 0 V and VDD. When Vi=VDD, the node G becomes 2×VDD and the drain-source voltage of the M5 becomes 2×VDD, and therefore, the withstand voltage is exceeded.

Figure 4A:
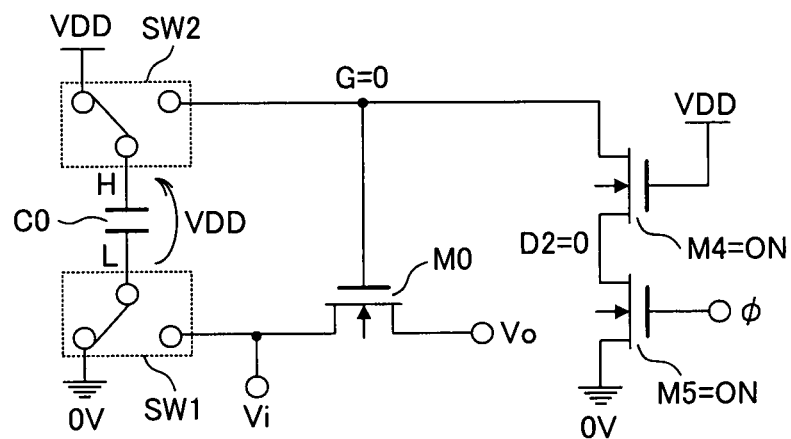
FIG. 4A and FIG. 4B are diagrams of the BSW that has been modified so as to avoid the problem of withstand voltage.
Figure 4B:
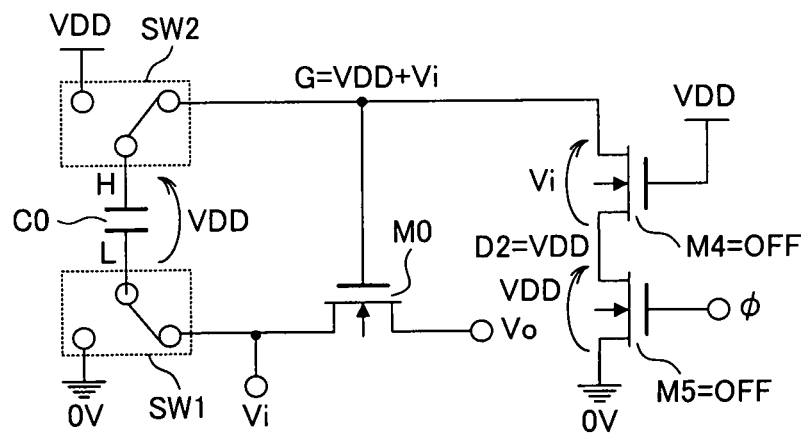

FIG. 4A and FIG. 4B are diagrams of the BSW that has been modified so as to avoid the problem of withstand voltage. FIG. 4A illustrates the state where the sampling transistor is off and FIG. 4B illustrates the state where the sampling transistor is on.

The circuits in FIG. 4A and FIG. 4B are each the circuit in FIG. 3A in which an NMOS transistor M4 is inserted between the drain of the M5 and the node G. To the gate of the M4, VDD is applied. As illustrated in FIG. 4A, when Φ=VDD, the M5 turns on and a connection node D2 of the M4 and the M5 becomes 0 V, and therefore, the M4 turns on, the node G becomes 0 V, and the M0 turns off.

As illustrated in FIG. 4B, when Φ=0 V, the node G becomes Vi+VDD, the M5 turns off, and the M0 turns on. At this time, because the node D2 becomes VDD, the M4 turns off, the drain-source voltage of the M5 becomes VDD, and the drain-source voltage of the M4 becomes Vi (VDD at the maximum), and therefore, the drain-source voltage of the M5 does not exceed the withstand voltage.

As described previously, in the state where the M0 is off (FIG. 4A), the power storage capacitor C0 is charged to the power source voltage VDD and the gate voltage of the M0 is controlled to be 0 V. On the other hand, in the state where the M0 is on (FIG. 4B), the gate-source voltage of the M0 is VDD and is almost constant. As described above, in the constant state, it is unlikely that Vgs of the transistors M4 and M5 exceeds the withstand voltage in the BSW in FIGS. 4A and 4B. However, transiently, there may occur a case where a voltage exceeding the withstand voltage is applied to the M4. In the following, a transient state where the M0 changes from off to on and from on to off is explained.

Figure 5:
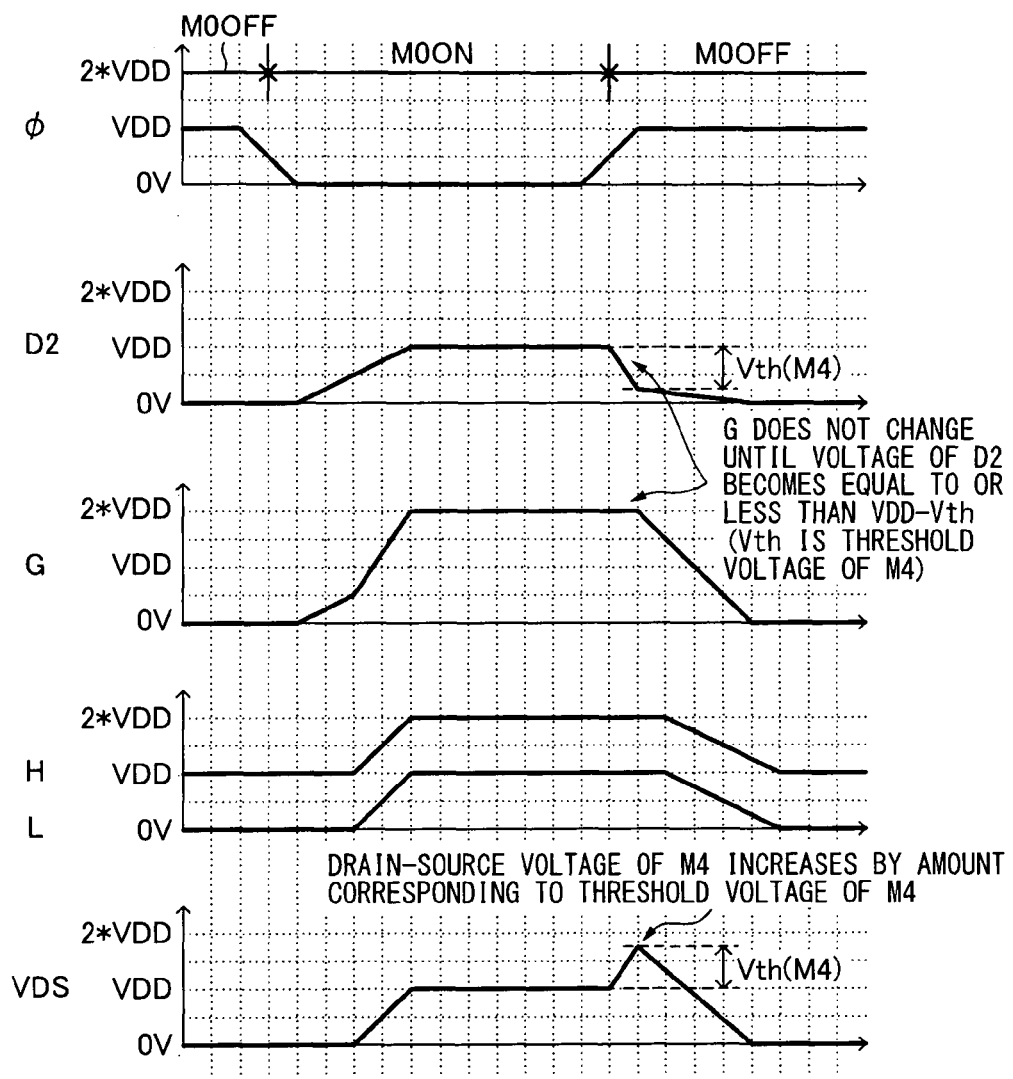
FIG. 5 is a diagram illustrating an operation sequence of the BSW in FIG. 4A and FIG. 4B.

FIG. 5 is a diagram illustrating an operation sequence of the BSW in FIG. 4A and FIG. 4B.

When the M0 makes a transition from off to on, the control signal Φ changes from VDD to 0 V. At this time, by the M5 turning off, the node D2 changes from 0 V to VDD. Next, by the M4 turning off, the node H connecting to the node G (SW2), and the node L connecting to the input node (Vi), the node L, the node H, and the node G increase in voltage in accordance with the analog signal Vi. In FIG. 5, Vi=VDD, and therefore, the node L increases in voltage up to VDD, and the node H and the node G increase in voltage up to 2×VDD.

When the M0 makes a transition from on to off, the control signal Φ changes from 0 V to VDD. At this time, by the M5 turning on, the node D2 changes from VDD to 0 V. Next, the M4 turns on, the node G is connected to 0 V (changed from VDD+Vi to 0 V), the node L is connected to 0 V (SW1), and the node H is connected to VDD (SW2).

When the M0 makes a transition from on to off, the M4 and M5 are in charge of dropping the node G to 0 V. When the M5 turns on and the node D2 changes from VDD to 0 V, if the threshold value of the M4 is taken to be Vth (M4), the drain-source voltage of the M4 increases until the voltage of the node D2 becomes equal to or less than VDD-Vth (M4).

The voltage of the ideal node G is VDD+Vi, and therefore, a drain-source voltage VDS of the M4 increases up to Vi+Vth (M4). As described above, when the M0 makes a transition from on to off, there occurs a case where the drain-source voltage of the M4 exceeds the transistor withstand voltage.

When the M0 makes a transition from on to off, in the circuit configuration of the BSW illustrated in FIG. 4, it is unavoidable that the drain-source voltage of the M4 increases up to Vi+Vth (M4). Because of this, in the BSW of the embodiment that is explained in the following, an increase in the drain-source voltage VDS is avoided so that the transistor (M4) does not exceed the withstand voltage when the M0 makes a transition from on to off.

Figure 6:
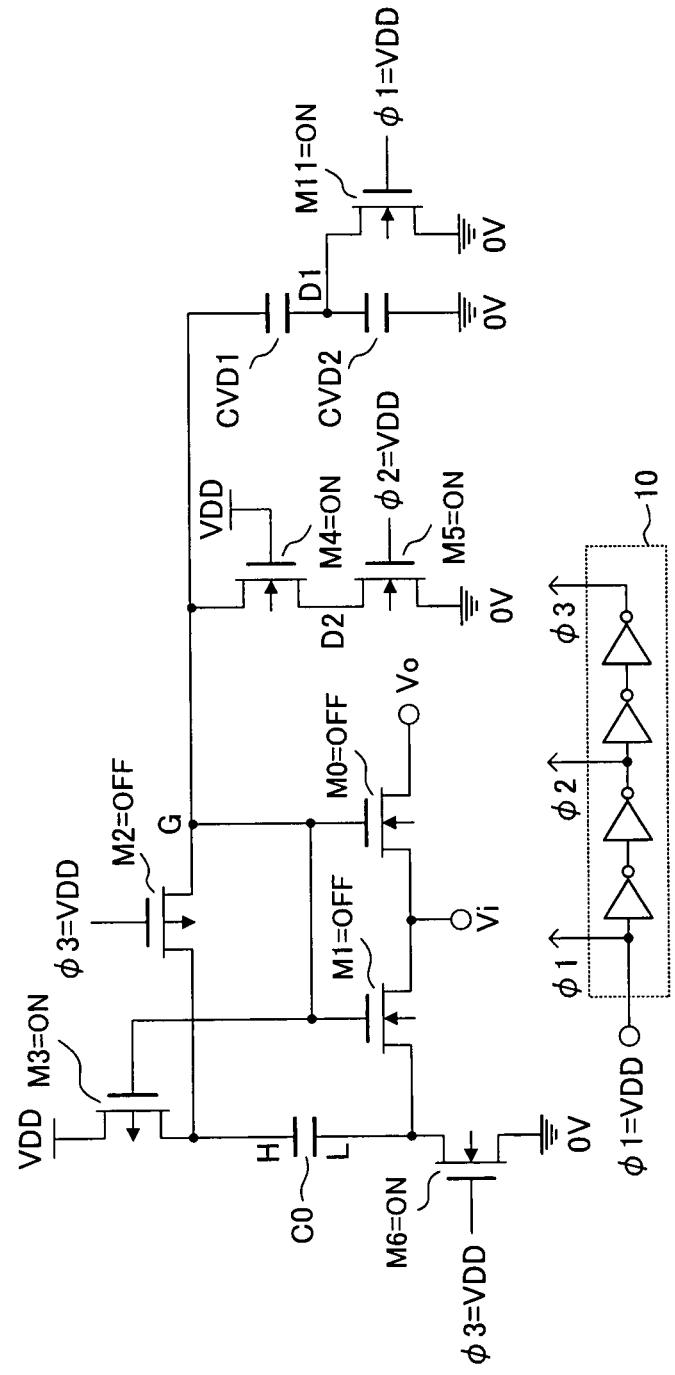
FIG. 6 is a circuit diagram of the bootstrap switch (BSW) of the embodiment, illustrating the state where the sampling transistor is off.

FIG. 6 is a circuit diagram of the bootstrap switch (BSW) of the embodiment, illustrating the state where the sampling transistor is off.

Figure 7:
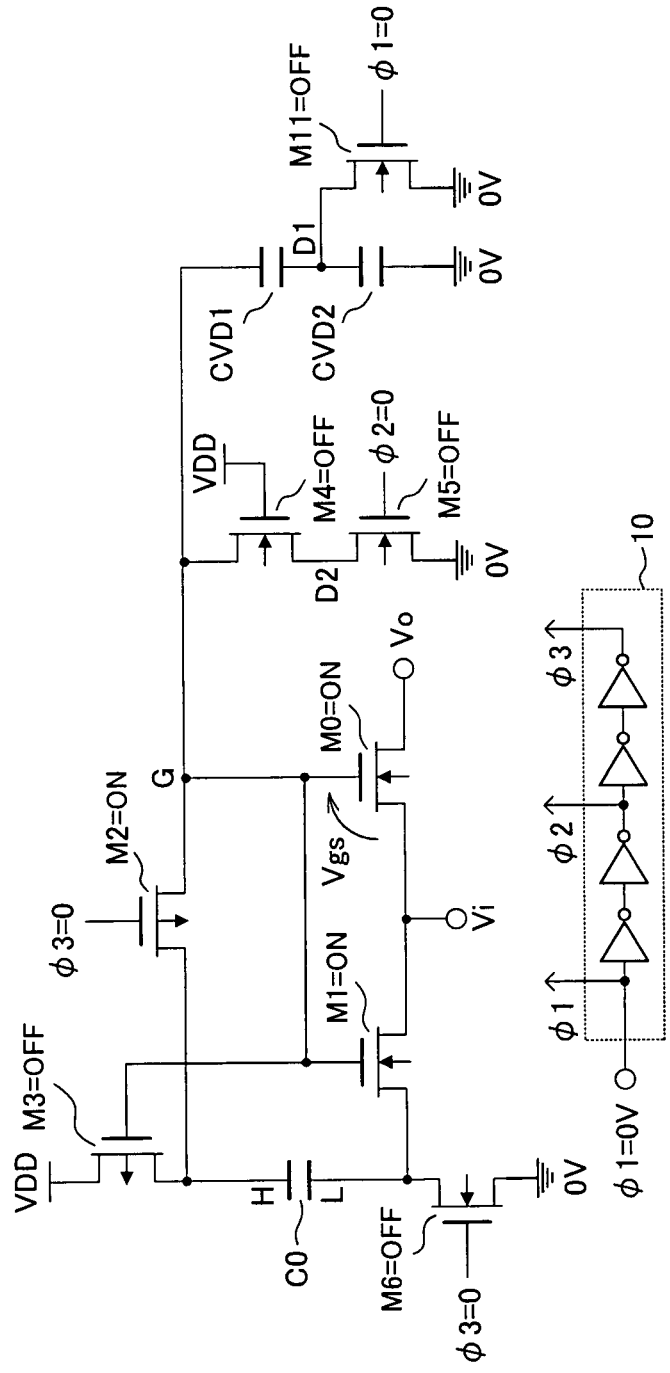

FIG. 7 is a circuit diagram of the bootstrap switch (BSW) of the embodiment, illustrating the state where the sampling transistor is on.

In FIG. 6, reference symbol 10 denotes a control signal generation circuit configured to generate control signals Φ2 and Φ3 from a control signal Φ1. The control signal Φ2 is a signal obtained by delaying the control signal Φ1 and the control signal Φ3 is a signal obtained by further delaying the control signal Φ1.

The BSW of the embodiment has the sampling transistor M0 that is connected between the input node to which the analog input signal Vi is input and the output node from which the analog output signal Vo is output. The M0 is a main transistor that transmits the analog input signal Vi as the analog output signal Vo.

The BSW of the embodiment further has a PMOS transistor M3, the power storage capacitor C0, and an NMOS transistor M6 that are connected in series between the VDD power source and the 0V power source. The high-side terminal of the power storage capacitor C0 is represented by the node H and the low-side terminal by the node L. The gate of the M3 is connected to the gate of the M0 (node G) and to the gate of the M6, the control signal Φ3 is applied. The BSW of the embodiment further has an NMOS transistor M1 that is connected between the input node and the node L of the power storage capacitor C0, and a PMOS transistor M2 that is connected between the gate of the M0 (node G) and the node H of the power storage capacitor C0. The gate of the M1 is connected to the gate of the M0 (node G) and to the gate of the M2, the control signal Φ3 is applied. The M1 and M6 form the SW1 in FIG. 4A and FIG. 4B. The M2 and M3 form the SW2 in FIG. 4A and FIG. 4B.

The BSW of the embodiment further has the NMOS transistors M4 and M5 that are connected in series between the gate of the M0 (node G) and the 0V power source. To the gate of the M4, VDD is applied and to the gate of the M5, the control signal Φ2 is applied. The M4 and M5 in the embodiment correspond to the M4 and M5 in FIG. 4A and FIG. 4B.

The above configuration is the same as that of the BSW in FIGS. 4A and 4B.

The BSW of the embodiment further has a damping capacitor CVD1 and a damping capacitor CVD2 that are connected in series between the gate of the M0 (node G) and the 0V power source, and an NMOS transistor M11 that is connected between a connection the node D1 of the CVD1 and CVD2, and the 0V power source. To the gate of the M11, the control signal Φ1 is applied. Here, the circuit formed by the CVD1, CVD2, and M11 is referred to as a protection circuit. In other words, the BSW of the embodiment differs from the circuit in FIG. 4A and FIG. 4B in that the protection circuit is added.

The damping capacitor CVD1 is provided in order to protect the M11 so that the withstand voltage of the M11 is achieved and to lower the voltage of the node G when the M0 makes a transition from on to off. The control signal Φ1 of the M11 is applied in order to reduce the drain-source voltage of the M4 in advance before the M5 turns on and the drain-source voltage of the M4 increases. The damping capacitor CVD2 is provided in order to prevent the voltage of the node G from being damped by reducing the serial capacitance of the damping capacitor CVD1 and the damping capacitor CVD2 in the constant state where the M0 is on. The reason is that if the voltage of the node G is damped when the M0 is on, the gate-source voltage of the M0 is reduced and the on-resistance increases. Other basic operations are the same as those of the circuit in FIGS. 4A and 4B, and the circuit operation is explained with the added protection circuit being included.

As illustrated in FIG. 6, when Φ=VDD and the M0 is in the off state, as in the circuit in FIG. 4A and FIG. 4B, the power storage capacitor C0 is charged to the power source voltage VDD, the M5 and M4 turn on, and the gate voltage of the M0 is controlled to be 0 V. At this time, the gate of the M11 is VDD, and therefore, the M11 turns on and the node D1 is also controlled to be 0 V.

On the other hand, as illustrated in FIG. 7, when Φ=0 V and the M0 is in the on state, as in the circuit in FIGS. 4A and 4B, the M5 and M4 turn off, the gate voltage of the M0 becomes Vi+VDD, and the gate-source voltage Vgs of the M0 becomes VDD and is almost constant.

At this time, the gate of the M11 is 0 V, and therefore, the M11 turns off and the voltage of the node D1 becomes a voltage obtained by dividing the voltage of the node G in a ratio between the capacitances of the damping capacitor CVD1 and the damping capacitor CVD2.

Next, the transient state where the M0 makes a transition from off to on and from on to off is explained.

FIG. 8 is a diagram illustrating the operation sequence of the BSW of the embodiment. FIG. 8 illustrates the case where Vi=VDD.

First, the case where the M0 makes a transition from off to on is explained.

The control signal Φ1 changed from VDD to 0 V. The M11 that is added to the BSW of the embodiment turns off, and therefore, to the node G, the damping capacitor CVD1 and the damping capacitor CVD2 connected in series is connected between the node G and the 0V power source. The D1 becomes a voltage obtained by dividing the voltage of the node G in a ratio between the capacitances of the damping capacitor CVD1 and the damping capacitor CVD2.

Next, when the control signal Φ2 changes from VDD to 0 V, the M5 turns off. In response to this, the node D2 changes from 0 V to VDD and the M4 turns off.

Finally, by the control signal Φ3, the node H of the power storage capacitor C0 is connected to the node G, and the node L is connected to the input node and Vi is applied. Due to this, the node L, the node H, and the node G enter the state of fluctuating in accordance with the analog signal Vi.

In FIG. 8, Vi=VDD, and therefore, the node L of the power storage capacitor C0 becomes VDD and the node H of the power storage capacitor C0 and the node G increase in voltage up to 2×VDD.

The voltage of the node G when the M0 is on is found from expression (1) below.

$$G=(VDD+Vi) \times C0/(C0+C) \qquad (1)$$

Here, C=CVD1×CVD2/(CVD1+CVD2).

Next, the case where the M0 makes a transition from on to off is explained.

The control signal Φ1 changes from 0 V to VDD. The M11 that is added to the BSW of the embodiment turns on, and therefore, a state is brought about where only the damping capacitor CVD1 is connected to the node G between the node G and the 0V power source.

Next, when the control signal Φ2 changes from 0 V to VDD, the M5 turns on and the node D2 changes from VDD to 0 V. In response to this, the M4 turns on and the node G is connected to 0 V (changed from VDD+Vi to 0 V).

Finally, by the control signal Φ3, the node L of the power storage capacitor C0 is connected to 0 V and the node H of the power storage capacitor C0 is connected to VDD.

When the M0 makes a transition from on to off, the M4 and M5 are in charge of dropping the node G to 0 V. However, unlike the circuit in FIGS. 4A and 4B, in the BSW of the embodiment, before the node G is dropped to 0 V by the M4 and M5, the voltage of the node G is divided in a ratio between the capacitances of the power storage capacitor C0 and the damping capacitor CVD1 by connecting the damping capacitor CVD1 to the node G.

By lowering the voltage of the node G by dividing the voltage in a ratio between the capacitances of the power storage capacitor C0 and the damping capacitor CVD1, it is possible to reduce the drain-source voltage Vgs of the M4.

The voltage of the node G at this time is found from expression (2) below (see "DAMPING BY CVD1" in FIG. 8).

$$G=(VDD+Vi) \times C0/(C0+CVD1) \qquad (2)$$

After this, when the M5 turns on and the node D2 changes from VDD to 0 V, the drain-source voltage VDS of the M4 increases until VDS reaches a voltage exceeding the threshold value of the M4.

However, it is possible to create a design so that the withstand voltage is not exceeded because the drain-source voltage of the M4 can be reduced in advance by the damping capacitor CVD1.

As explained above, in the circuit illustrated in FIGS. 4A and 4B, it is unavoidable that the drain-source voltage of the M4 increases up to Vi+Vth when the M0 makes a transition from on to off. The reason is that in order to cause the M0 to make a transition from on to off, it is necessary to reduce the voltage of the node D2 until a voltage exceeding the threshold value is reached.

In contrast to this, in the circuit of the BSW of the embodiment, at the timing before the node G is changed from VDD+Vi to 0 V by the M4 and M5, the M11 is turned on and the voltage of the node G is dropped. It is possible to arbitrarily design the voltage of the node G when the M11 turned by determining the power storage capacitor C0 and the damping capacitor CVD1 in accordance with expression (2). Due to this, the problem in that the drain-source voltage VDS of the M4 exceeds the withstand voltage can be solved. Consequently, the capacitance value of the damping capacitor CVD1 becomes a value comparatively close to the capacitance value of the power storage capacitor C0.

Further, the damping capacitor CVD2 is used in order to reduce the serial capacitance of the damping capacitor CVD1 and the damping capacitor CVD2 in the constant state where the M0 is on. It is possible to arbitrarily design the voltage of the node G at this time by determining the power storage capacitor C0, the damping capacitor CVD1, and the damping capacitor CVD2 in accordance with expression (1).

The on-resistance of the switch does not become worse because it is possible to suppress the damping of the node G when the M0 is on by reducing the serial capacitance of the damping capacitor CVD1 and the damping capacitor CVD2. Consequently, the capacitance value of the damping capacitor CVD2 becomes a value sufficiently small compared to the capacitance value of the damping capacitor CVD1.

Next, an example of a circuit and a system to which the switch circuit of the embodiment is applied is explained.

Figure 9A:
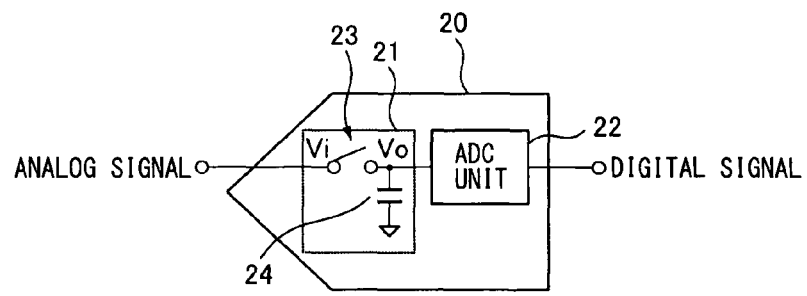
FIG. 9A is a diagram illustrating a configuration example of a circuit to which the switch circuit of the embodiment is applied.
Figure 9B:
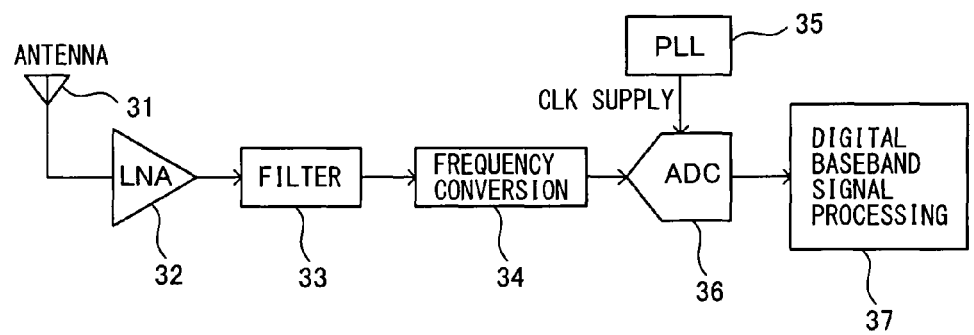
FIG. 9B is a diagram illustrating a configuration example of a reception system to which the switch circuit of the embodiment is applied.
Figure 9C:
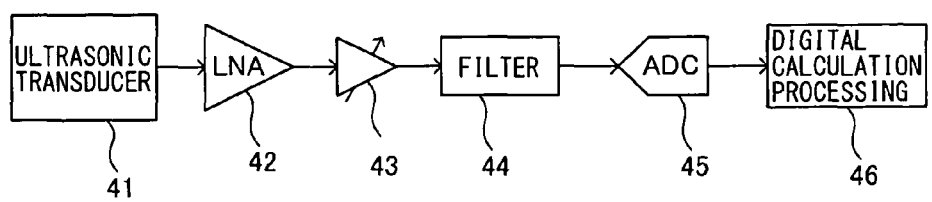
FIG. 9C illustrates an ultrasonic reception system to which the switch circuit of the embodiment is applied.

FIG. 9A is a diagram illustrating a configuration example of a circuit to which the switch circuit of the embodiment is applied. FIG. 9B is a diagram illustrating a configuration example of a reception system to which the switch circuit of the embodiment is applied. FIG. 9C illustrates an ultrasonic reception system to which the switch circuit of the embodiment is applied.

As illustrated in FIG. 9A, an ADC circuit 20 has a sampling circuit 21 configured to sample an analog signal that is input and an ADC unit 22 configured to converted a sampled analog signal into a digital signal. The conversion method of the ADC unit 22 may be any method. The sampling circuit 21 has a switch circuit 23 and a sampling capacitor 24. By applying the switch circuit of the embodiment as the switch circuit 23, it is possible to form an ADC circuit whose accuracy of analog signal processing (here, AD conversion processing) is improved by a low withstand voltage circuit element. The ADC circuit 20 may be formed as a single semiconductor integrated circuit device or as part of a semiconductor integrated circuit device.

As illustrated in FIG. 9B, the reception system of radio communication equipment has an antenna 31, a low noise amplifier (LNA) 32, a filter 33, a frequency conversion unit 34, a PLL 35, an ADC circuit 36, and a digital baseband signal processing circuit unit 37. By applying the ADC circuit in FIG. 9A as the ADC circuit 36, it is possible to form a reception system whose accuracy of analog signal processing (reception processing) is improved by a low withstand voltage circuit element. For example, each of the ADC circuit 36 and the digital baseband signal processing unit 37 may be formed as a single semiconductor integrated circuit device.

As illustrated in FIG. 9C, the ultrasonic reception system has an ultrasonic transducer 41, a low noise amplifier (LNA) 43, a time gain correction circuit 43, a filter 44, an ADC circuit 45, and a digital calculation processing circuit unit 46. By applying the ADC circuit in FIG. 9A as the ADC circuit 45, it is possible to form an ultrasonic reception system whose accuracy of analog signal processing (here, ultrasonic reception processing) is improved by a low withstand voltage circuit element. For example, each of the ADC circuit 45 and the digital calculation processing circuit unit 46 may be formed as a single semiconductor integrated circuit device.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A switch circuit comprising:
   a sampling transistor including a source connected to an input node and a drain connected to an output node;
   a control circuit which is connected to a gate of the sampling transistor and configured to control turning on or off of the sampling transistor;
   a voltage holding circuit which is provided between the gate and the source of the sampling transistor and configured to maintain a voltage between the gate and the source of the sampling transistor constant when the sampling transistor is turned on; and
   a protection circuit which is provided in parallel to the control circuit and configured to lower a voltage that is applied to the gate of the sampling transistor when the sampling transistor makes a transition from on to off.

2. The switch circuit according to claim 1, wherein the voltage holding circuit includes:
   a power storage capacitance element;
   a first charge switch configured to connect one terminal of the power storage capacitance element to a first potential power source;
   a second charge switch configured to connect the other terminal of the power storage capacitance element to a second potential power source whose voltage is lower than a voltage of the first potential power source;
   an input connection switch which is connected between the input node and the other terminal of the power storage capacitance element; and
   a gate connection switch which is connected between the gate of the sampling transistor and the one terminal of the power storage capacitance element,
   wherein
   when the sampling transistor turns on, the input connection switch and the gate connection switch turn on, the first charge switch and the second charge switch turn off, and the power storage capacitance element supplies a first voltage to the gate of the sampling transistor, the first voltage being obtained by adding the voltage of the power storage capacitance element to the voltage of the input node, and
   when the sampling transistor turns off, the input connection switch and the gate connection switch turn off, the first charge switch and the second charge switch turn on, and the power storage capacitance element is charged.

3. The switch circuit according to claim 2, wherein the control circuit includes a first transistor and a second transistor which are connected in series between the gate of the sampling transistor and the second potential power source,
   the first transistor and the second transistor turn on when the sampling transistor turns off, and
   at least one of the first transistor and the second transistor turns off when the sampling transistor turns on.

4. The switch circuit according to claim 2, wherein the protection circuit includes:
   a first damping capacitance element and a second damping capacitance element which are connected in series between the gate of the sampling transistor and the second potential power source; and
   a damping switch which is connected between a connection node of the first damping capacitance element and the second damping capacitance element, and the second potential power source, wherein
   the damping switch enters a conduction state when the sampling transistor is turned off and enters a cutoff state when the sampling transistor is turned on, and
   the damping switch enters the conduction state before the gate connection switch is cut off and the first transistor and the second transistor are brought into conduction when the sampling transistor makes a transition from on to off.

5. The switch circuit according to claim 3, wherein the protection circuit includes:
   a first damping capacitance element and a second damping capacitance element which are connected in series between the gate of the sampling transistor and the second potential power source; and a damping switch which is connected between a connection node of the first damping capacitance element and the second damping capacitance element, and the second potential power source, wherein the damping switch enters a conduction state when the sampling transistor is turned off and enters a cutoff state when the sampling transistor is turned on, and the damping switch enters the conduction state before the gate connection switch is cut off and the first transistor and the second transistor are brought into conduction when the sampling transistor makes a transition from on to off.

6. An analog-to-digital converter comprising:

a sampling circuit configured to sample an analog signal; and an AD conversion unit configured to convert the analog signal into a digital signal, wherein the sampling circuit includes:

a sampling capacitance element; and a switch circuit configured to control turning on or off of inputting of the analog signal to the sampling capacitance element, wherein and the switch circuit includes:

a sampling transistor including a source connected to an input node and a drain connected to an output node;

a control circuit which is connected to a gate of the sampling transistor and configured to control turning on or off of the sampling transistor;

a voltage holding circuit which is provided between the gate and the source of the sampling transistor and which maintains a voltage between the gate and the source of the sampling transistor constant when the sampling transistor is turned on; and a protection circuit which is provided in parallel to the control circuit and configured to lower a voltage that is applied to the gate of the sampling transistor when the sampling transistor makes a transition from on to off.

7. The analog-to-digital converter according to claim 6, wherein the voltage holding circuit includes:

a power storage capacitance element;

a first charge switch configured to connect one terminal of the power storage capacitance element to a first potential power source;

a second charge switch configured to connect the other terminal of the power storage capacitance element to a second potential power source whose voltage is lower than a voltage of the first potential power source;

an input connection switch which is connected between the input node and the other terminal of the power storage capacitance element; and a gate connection switch which is connected between the gate of the sampling transistor and the one terminal of the power storage capacitance element, wherein when the sampling transistor turns on, the input connection switch and the gate connection switch turn on, the first charge switch and the second charge switch turn off, and the power storage capacitance element supplies a first voltage to the gate of the sampling transistor, the first voltage being obtained by adding the voltage of the power storage capacitance element to the voltage of the input node, and when the sampling transistor turns off, the input connection switch and the gate connection switch turn off, the first charge switch and the second charge switch turn on, and the power storage capacitance element is charged.

8. The analog-to-digital converter according to claim 7, wherein the control circuit includes a first transistor and a second transistor which are connected in series between the gate of the sampling transistor and the second potential power source, the first transistor and the second transistor turn on when the sampling transistor turns off, and at least one of the first transistor and the second transistor turns off when the sampling transistor turns on.

9. The analog-to-digital converter according to claim 7, wherein the protection circuit includes:

a first damping capacitance element and a second damping capacitance element which are connected in series between the gate of the sampling transistor and the second potential power source; and a damping switch which is connected between a connection node of the first damping capacitance element and the second damping capacitance element, and the second potential power source, wherein the damping switch enters a conduction state when the sampling transistor is turned off and enters a cutoff state when the sampling transistor is turned on, and the damping switch enters the conduction state before the gate connection switch is cut off and the first transistor and the second transistor are brought into conduction when the sampling transistor makes a transition from on to off.

10. The analog-to-digital converter according to claim 8, wherein the protection circuit includes:

a first damping capacitance element and a second damping capacitance element which are connected in series between the gate of the sampling transistor and the second potential power source; and a damping switch which is connected between a connection node of the first damping capacitance element and the second damping capacitance element, and the second potential power source, wherein the damping switch enters a conduction state when the sampling transistor is turned off and enters a cutoff state when the sampling transistor is turned on, and the damping switch enters the conduction state before the gate connection switch is cut off and the first transistor and the second transistor are brought into conduction when the sampling transistor makes a transition from on to off.

11. An integrated circuit comprising:

an analog-to-digital converter configured to convert an analog signal into a digital signal; and a processing circuit configured to process the digital signal, wherein the analog-to-digital converter includes:

a sampling circuit configured to sample an analog signal; and an AD conversion unit configured to convert the analog signal into digital data, the sampling circuit includes:
a sampling capacitance element; and
a switch circuit configured to control turning on or off of inputting of the analog signal to the sampling capacitance element, and
the switch circuit includes:
a sampling transistor including a source connected to an input node and a drain connected to an output node;
a control circuit which is connected to a gate of the sampling transistor and configured to control turning on or off of the sampling transistor;
a voltage holding circuit which is provided between the gate and source of the sampling transistor and configured to maintains a voltage between the gate and the source of the sampling transistor constant when the sampling transistor is turned on; and
a protection circuit which is provided in parallel to the control circuit and which lowers a voltage that is applied to the gate of the sampling transistor when the sampling transistor makes a transition from on to off.

12. The integrated circuit according to claim 11, wherein the voltage holding circuit includes:
a power storage capacitance element;
a first charge switch which connects one terminal of the power storage capacitance element to a first potential power source;
a second charge switch which connects the other terminal of the power storage capacitance element to a second potential power source whose voltage is lower than a voltage of the first potential power source;
an input connection switch which is connected between the input node and the other terminal of the power storage capacitance element; and
a gate connection switch which is connected between the gate of the sampling transistor and the one terminal of the power storage capacitance element, wherein
when the sampling transistor turns on, the input connection switch and the gate connection switch turn on, the first charge switch and the second charge switch turn off, and the power storage capacitance element supplies a first voltage to the gate of the sampling transistor, the first voltage being obtained by adding the voltage of the power storage capacitance element to the voltage of the input node, and
when the sampling transistor turns off, the input connection switch and the gate connection switch turn off, the first charge switch and the second charge switch turn on, and the power storage capacitance element is charged.

13. The integrated circuit according to claim 12, wherein the control circuit includes a first transistor and a second transistor which are connected in series between the gate of the sampling transistor and the second potential power source,
the first transistor and the second transistor turn on when the sampling transistor turns off, and
at least one of the first transistor and the second transistor turns off when the sampling transistor turns on.

14. The integrated circuit according to claim 12, wherein the protection circuit includes:
a first damping capacitance element and a second damping capacitance element which are connected in series between the gate of the sampling transistor and the second potential power source; and
a damping switch which is connected between a connection node of the first damping capacitance element and the second damping capacitance element, and the second potential power source, wherein
the damping switch enters a conduction state when the sampling transistor is turned off and enters a cutoff state when the sampling transistor is turned on, and
the damping switch enters the conduction state before the gate connection switch is cut off and the first transistor and the second transistor are brought into conduction when the sampling transistor makes a transition from on to off.

15. The analog-to-digital converter according to claim 13, wherein
the protection circuit includes:
a first damping capacitance element and a second damping capacitance element which are connected in series between the gate of the sampling transistor and the second potential power source; and
a damping switch which is connected between a connection node of the first damping capacitance element and the second damping capacitance element, and the second potential power source, wherein
the damping switch enters a conduction state when the sampling transistor is turned off and enters a cutoff state when the sampling transistor is turned on, and the damping switch enters the conduction state before the gate connection switch is cut off and the first transistor and the second transistor are brought into conduction when the sampling transistor makes a transition from on to off.

* * * * *